_(12)_ United States Patent
Kang et al.

(10) Patent No.: US 10,770,623 B2
(45) Date of Patent: Sep. 8, 2020

(54) LIGHT EMITTING DIODE AND ELECTROLUMINESCENT DISPLAY DEVICE

(71) Applicant: LG DISPLAY CO., LTD., Seoul (KR)

(72) Inventors: Ji-Yeon Kang, Paju-si (KR); Kyung-Kook Jang, Paju-si (KR); So-Mang Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/169,191

(22) Filed: Oct. 24, 2018

(65) Prior Publication Data

US 2019/0131492 A1 May 2, 2019

(30) Foreign Application Priority Data

Oct. 26, 2017 (KR) .................. 10-2017-0140214

(51) Int. Cl.
*H01L 33/50* (2010.01)
*H01L 33/26* (2010.01)
*H01L 33/06* (2010.01)
*H01L 27/32* (2006.01)
*H01L 51/50* (2006.01)
(Continued)

(52) U.S. Cl.
CPC ............ *H01L 33/26* (2013.01); *H01L 27/156* (2013.01); *H01L 27/322* (2013.01); *H01L 33/06* (2013.01); *H01L 33/18* (2013.01); *H01L 33/502* (2013.01); *H01L 51/502* (2013.01);
(Continued)

(58) Field of Classification Search
CPC ......... H01L 27/15; H01L 33/06; H01L 33/08; H01L 33/16; H01L 33/28; H01L 33/42; H01L 33/0087; H01L 33/26; H01L 33/18; H01L 33/502; H01L 33/405; H01L 33/50; H01L 27/3209; H01L 27/156; H01L 27/1214; H01L 27/32; H01L 27/3258; H01L 27/3251; H01L 27/3225; H01L 27/322; H01L 27/3262; H01L 51/50; H01L 51/52; H01L 51/525; H01L 51/502;
(Continued)

(56) References Cited

U.S. PATENT DOCUMENTS

2012/0138894 A1 6/2012 Qian et al.
2014/0291645 A1* 10/2014 Inoue .................. C07D 491/048
257/40

(Continued)

FOREIGN PATENT DOCUMENTS

CN 102473800 A 5/2012
CN 103345884 A 10/2013
(Continued)

OTHER PUBLICATIONS

Search Report dated Dec. 5, 2018 issued in the corresponding European Patent Application No. 18202300.2, pp. 1-9.
(Continued)

*Primary Examiner* — Chuong A Luu
(74) *Attorney, Agent, or Firm* — Polsinelli PC

(57) ABSTRACT

An emitting diode includes a first electrode in a first pixel; a first emitting layer positioned on the first electrode and in the first pixel and including a first amorphous oxide semiconductor material and a first quantum dot, wherein the first amorphous oxide semiconductor material includes an indium atom, a gallium atom and a zinc atom; and a second electrode covering the first emitting layer.

20 Claims, 17 Drawing Sheets

(51) Int. Cl.
  H01L 27/15 (2006.01)
  H01L 33/18 (2010.01)
  H01L 27/12 (2006.01)
  H01L 33/40 (2010.01)
  H01L 33/42 (2010.01)
(52) U.S. Cl.
  CPC ........ *H01L 27/1214* (2013.01); *H01L 33/405* (2013.01); *H01L 33/42* (2013.01)
(58) Field of Classification Search
  CPC ............... C09K 11/562; Y10S 977/774; Y10S 977/892; Y10S 977/95; B82Y 40/00
  USPC .......................................................... 257/13
  See application file for complete search history.

(56) References Cited

U.S. PATENT DOCUMENTS

2014/0319566 A1* 10/2014 Perzlmaier ............ H01L 33/382 257/98
2015/0194467 A1    7/2015 Zhang et al.
2015/0228850 A1    8/2015 Zheng et al.
2016/0372630 A1* 12/2016 Jang ....................... H01L 33/025
2017/0069784 A1*  3/2017 Peng ................... H01L 33/0041

FOREIGN PATENT DOCUMENTS

| CN | 103579380 A | 2/2014 |
| CN | 105103327 A | 11/2015 |
| CN | 105810848 A | 7/2016 |
| WO | 2014/099080 A2 | 6/2014 |

OTHER PUBLICATIONS

Chinese Office Action and Search Report dated Jul. 3, 2020 in a counterpart Chinese Application No. CN 201811252297.5 (5 pages).

* cited by examiner

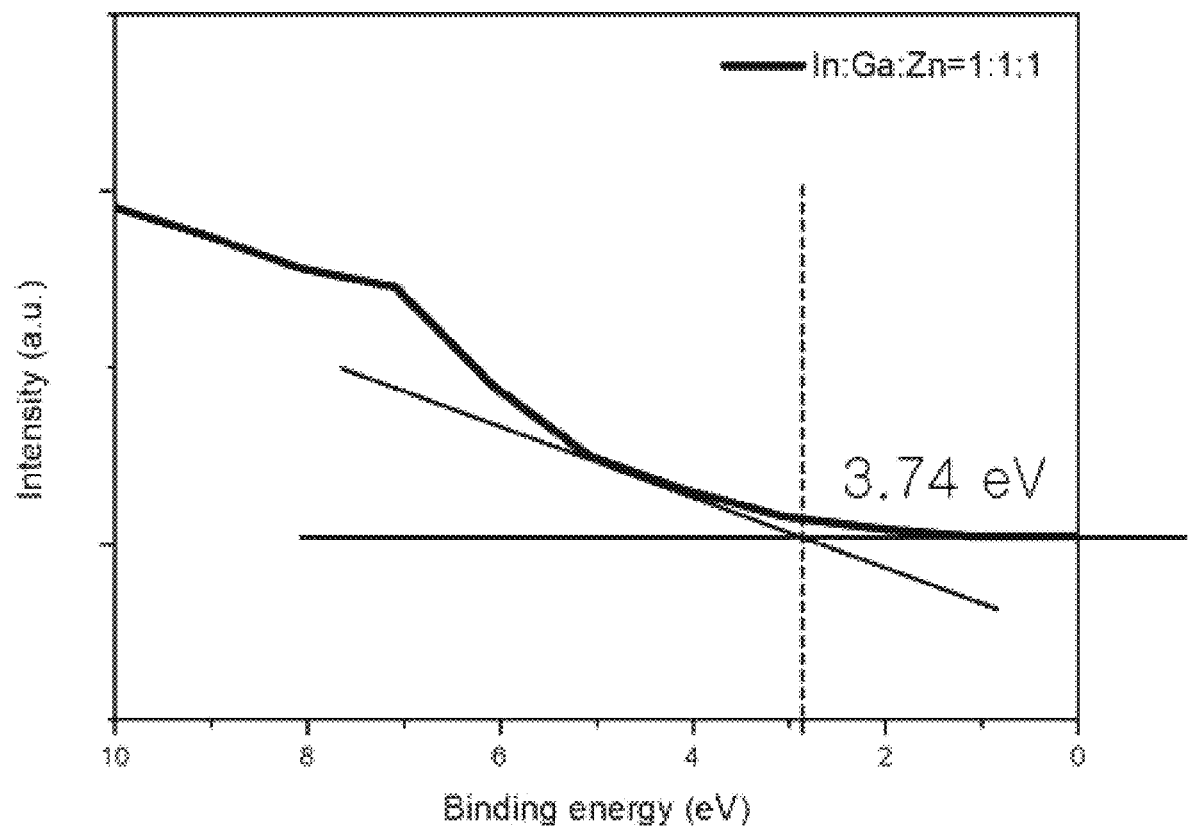

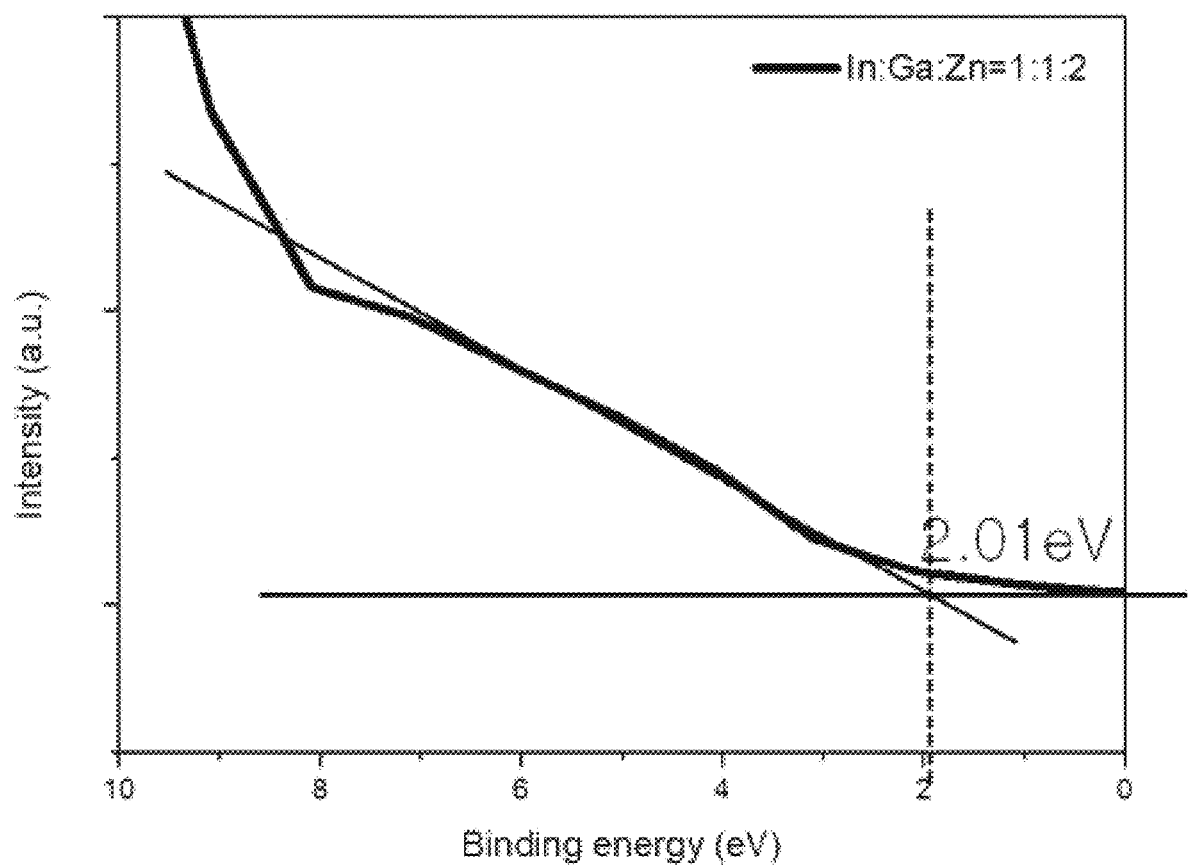

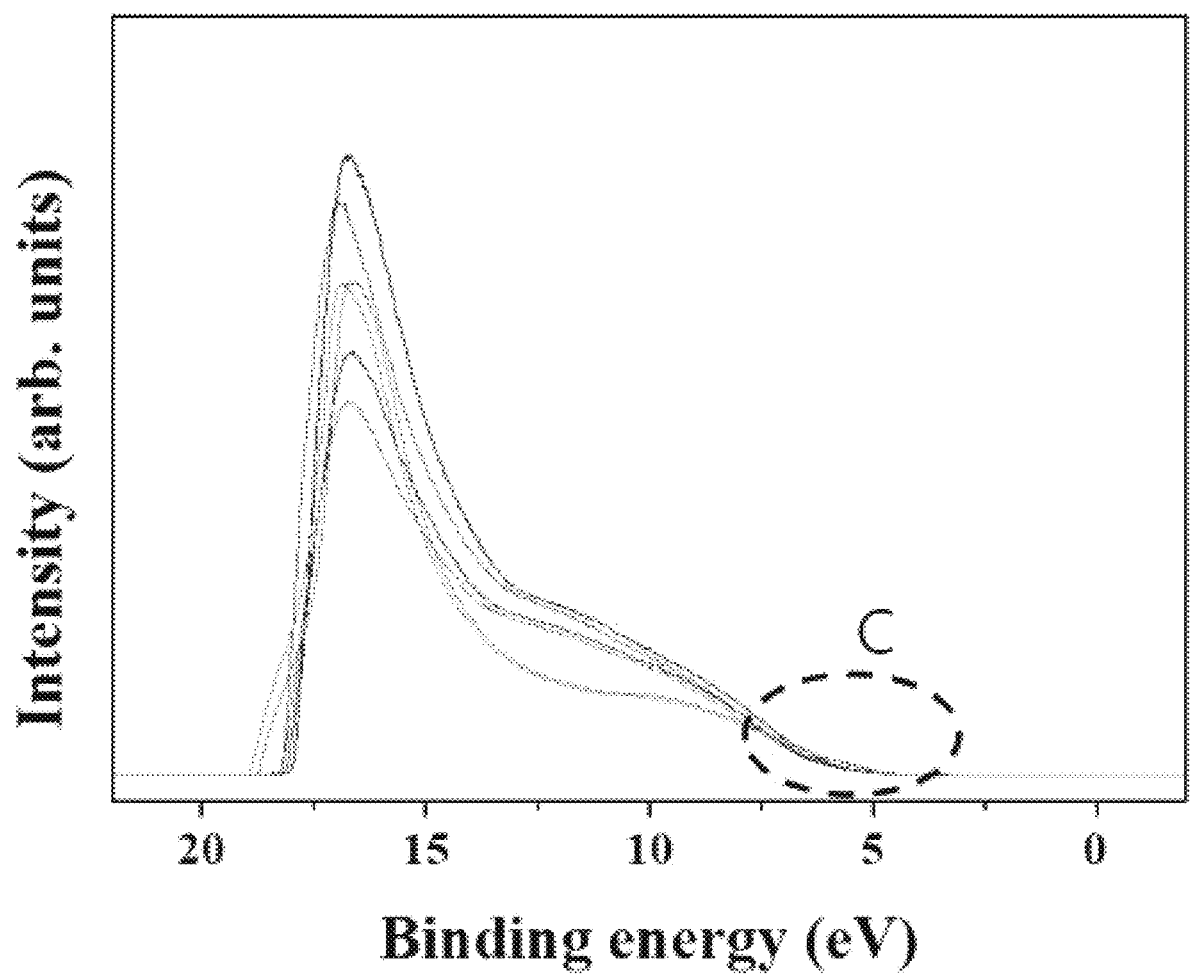

LIGHT EMITTING DIODE AND ELECTROLUMINESCENT DISPLAY DEVICE

CROSS-REFERENCE TO RELATED APPLICATION

The present application claims the benefit of Korean Patent Application No. 10-2017-0140214 filed in the Republic of Korea on Oct. 26, 2017, which is hereby incorporated by reference in its entirety.

BACKGROUND

Field of the Disclosure

The present disclosure relates to a display device, and more particularly, to an emitting diode and an electroluminescent display device each having an improved lifespan and an emitting property.

Description of the Background

As the information technology and the mobile communication technology have been developed, a display device being capable of displaying a visual image has also been developed. Flat panel display devices, such as a liquid crystal display (LCD) device a plasma display panel (PDP) device and an electroluminescent display device, are developed and commercialized because of the advantages in weight, power consumption, and so on.

The electroluminescent display device includes an emitting diode, and the emitting diode includes an electron injection electrode (i.e., cathode), a hole injection electrode (i.e., anode) and an emitting layer therebetween. The electron from the cathode and the hole from the anode are injected into the emitting layer to form an exciton, and the exciton is transited from the excited state to the ground state such that the light is emitted from the emitting diode.

The electroluminescent display device may include a red pixel, a green pixel and a blue pixel, and red light, green light and blue light are respectively emitted from the emitting diode in the red, green and blue pixels such that a color image is provided.

Recently, use of a quantum dot (QD) to display devices has been researched or studied.

In the QD, an electron in an unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

FIG. 1 is a schematic cross-sectional view of the related art emitting diode using a QD.

As shown in FIG. 1, the emitting diode D includes a first electrode 10 as an anode, a second electrode 20 as a cathode and facing the first electrode 10 and an emitting layer 30 positioned between the first and second electrodes 10 and 20 and including a hole injection layer (HIL) 31, a hole transporting layer (HTL) 33, an emitting material layer (EML) 35, which includes the QDs 40, an electron transporting layer (ETL) 37 and an electron injection layer (EIL) 39.

In the emitting diode D, the hole is transferred from the first electrode 10 into the EML 35 through the HIL 31 and the HTL 33, and the electron is transferred from the second electrode 20 into the EML 35 through the EIL 39 and the ETL 37. As a result, the light is emitted from the QD 40 in the EML 35.

However, there are problems in a short lifespan and a low emitting efficiency in the related art emitting diode D. Namely, the emitting diode is exposed to moisture such that the lifespan and the emitting efficiency of the emitting diode D are lowered.

SUMMARY

Accordingly, the present disclosure is directed to an emitting diode and an electroluminescent display device that substantially obviate one or more of the problems due to limitations and disadvantages of the related art.

In addition, the present disclosure is to provide an emitting diode and an electroluminescent display device having an improved lifespan and an emitting efficiency.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an emitting diode comprises a first electrode in a first pixel; a first emitting layer positioned on the first electrode and in the first pixel and including a first amorphous oxide semiconductor material and a first quantum dot, wherein the first amorphous oxide semiconductor material includes an indium atom, a gallium atom and a zinc atom; and a second electrode covering the first emitting layer.

In another aspect, an electroluminescent display device comprises a substrate; an emitting diode on the substrate, the emitting diode includes: a first electrode in a first pixel; a first emitting layer positioned on the first electrode and in the first pixel and including a first amorphous oxide semiconductor material and a first quantum dot, wherein the first amorphous oxide semiconductor material includes an indium atom, a gallium atom and a zinc atom; and a second electrode covering the emitting layer; and a thin film transistor positioned between the substrate and the emitting diode and connected to the first electrode.

In another aspect, an electroluminescent display device comprises a substrate including a first pixel; an emitting diode on the substrate; a thin film transistor positioned between the substrate and the emitting diode and connected to the emitting diode; and a first color conversion layer in the first pixel, wherein the first color conversion layer includes a first amorphous oxide semiconductor material and a first quantum dot, and the first amorphous oxide semiconductor material includes an indium atom, a gallium atom and a zinc atom.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings:

FIGS. 5A to 5E are graphs showing an UPS measuring results of amorphous oxide semiconductor materials;

FIGS. 9A and 9B are graphs showing an UPS measuring results of a blue QD;

DETAILED DESCRIPTION

Reference will now be made in detail to the aspects, examples of which are illustrated in the accompanying drawings.

Figure 1:
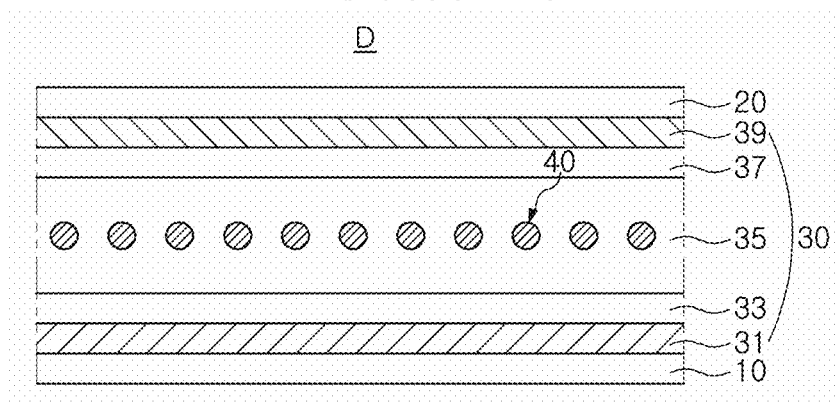
FIG. 1 is a schematic cross-sectional view of the related art emitting diode using a QD.
Figure 2:
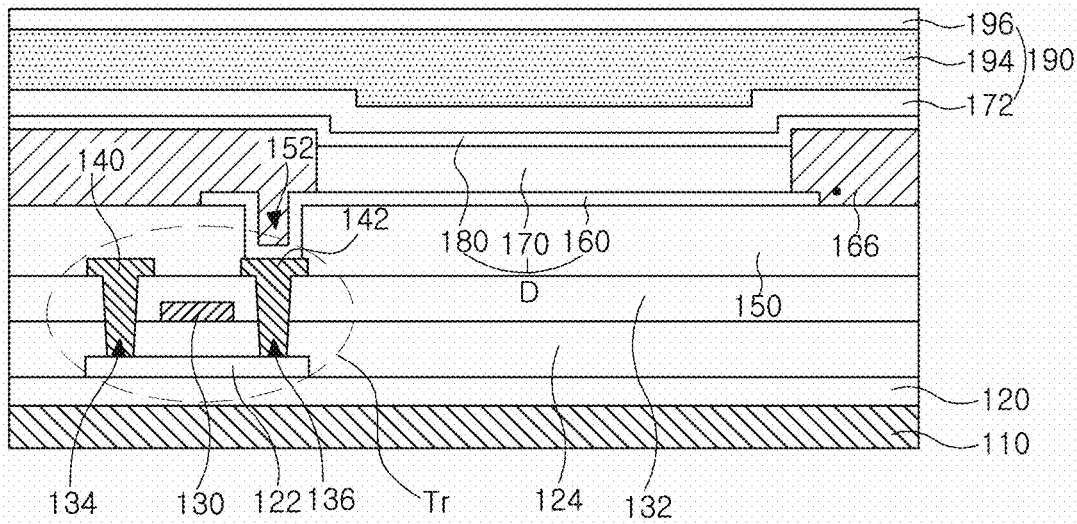
FIG. 2 is a schematic cross-sectional view of an electroluminescent display device according to a first aspect of the present disclosure.

FIG. 2 is a schematic cross-sectional view of an electroluminescent display device according to a first aspect of the present disclosure.

As shown in FIG. 2, the electroluminescent display device 100 according to the first aspect of the present disclosure includes a substrate 110, a thin film transistor (TFT) Tr on or over the substrate 110 and an emitting diode D connected to the TFT Tr.

The substrate 110 may be a glass substrate or a plastic substrate. For example, the substrate 110 may be formed of polyimide.

A buffer layer 120 is formed on the substrate 110, and the TFT Tr is formed on the buffer layer 110. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT as a driving element.

The gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 110 and cross each other to define a pixel region. In addition, a switching element, which is electrically connected to the gate line and the data line, may be disposed on the substrate 110. The switching element is electrically connected to the TFT Tr as the driving element.

In addition, a power line, which is parallel to and spaced apart from the gate line or the data line, may be formed on or over the substrate 110. Moreover, a storage capacitor for maintaining a voltage of the gate electrode 130 of the TFT Tr during one frame, may be further formed on the substrate 110.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the electroluminescent display device 100 is operated in a top-emission type, a reflection electrode or a reflection layer may be formed under the first electrode 160. For example, the reflection electrode or the reflection layer may be formed of aluminum-palladium-copper (APC) alloy.

A bank 166 is formed on the passivation layer 150 to cover an edge of the first electrode 160. The bank 166 exposes a center of the first electrode 160 in correspondence to the pixel region.

An emitting layer 170 is formed on the first electrode 170. The emitting layer 170 includes a QD and an amorphous oxide semiconductor material.

The QD may include a core and a shell surrounding (covering) the core. Each of the core and the shell may be formed of a semiconductor compound. Each of the core and the shell may be formed of a II-VI group compound or a III-V group compound in the periodic table.

For example, the core may be formed of one of CdSe, CdS, CdTe, ZnO, ZnSe, ZnS, ZnTe, HgSe, HgTe, CdZnSe, InP, InN, GaN, InSb, InAsP, InGaAs, GaAs, GaP, GaSb, AlP, Al, AlAs, AlSb, CdSeTe and ZnCdSe, and the shell may be formed of the other one of CdSe, CdS, CdTe, ZnO, ZnSe, ZnS, ZnTe, HgSe, HgTe, CdZnSe, InP, InN, GaN, InSb, InAsP, InGaAs, GaAs, GaP, GaSb, AlP, AN, AlAs, AlSb, CdSeTe and ZnCdSe.

The amorphous oxide semiconductor material may be amorphous indium-gallium-zinc oxide (a-IGZO).

The emitting layer 170 may have a single-layered structure of the EML including the QD and the amorphous oxide semiconductor material. To improve an emitting efficiency of the emitting diode D, the emitting layer 170 may have a multi-layered structure of the HIL, the HTL, the EML, the ETL and the EIL.

A second electrode 180 is formed over the substrate 110 including the emitting layer 170. The second electrode 180 covers the entire surface of a display region and may be formed of a conductive material having a relatively low work function to serve as a cathode. For example, the second electrode 180 may be formed of aluminum (Al), magnesium (Mg) or Al—Mg alloy.

The first electrode 160, the emitting layer 170 and the second electrode 180 constitute the emitting diode D.

An encapsulation film 190 is formed on the second electrode 180 to block or prevent the penetration of external moisture into the emitting diode D. For example, the encapsulation film 190 may include a first inorganic insulating layer 192, an organic insulating layer 194 and a second inorganic insulating layer 196 sequentially stacked, but it is not limited thereto.

In addition, a polarization plate (not shown) may be attached on an outer side of the encapsulation film 190 to reduce an ambient light reflection. For example, the polarization plate may be a circular polarization plate.

Figure 3A:
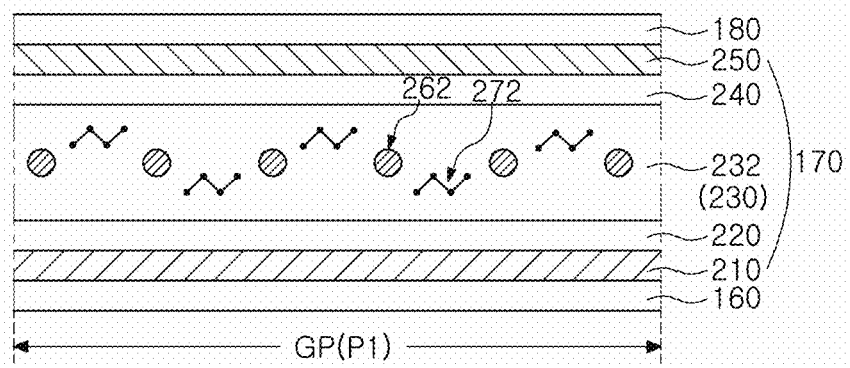
FIGS. 3A to 3C are schematic cross-sectional views of an emitting diode in each pixel of the electroluminescent display device according to the first aspect of the present disclosure.
Figure 3B:
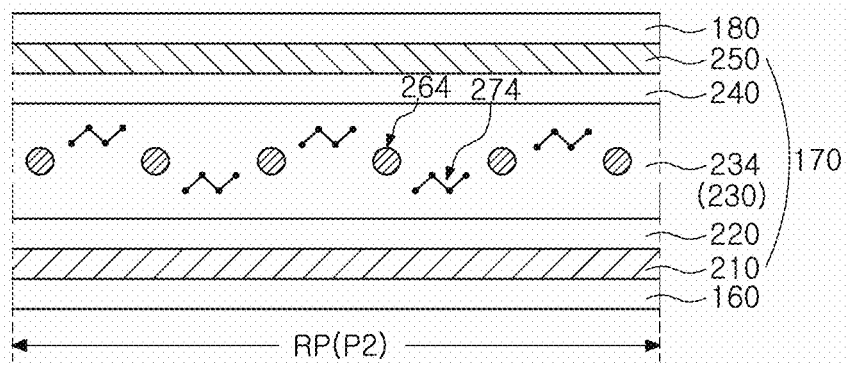
Figure 3C:
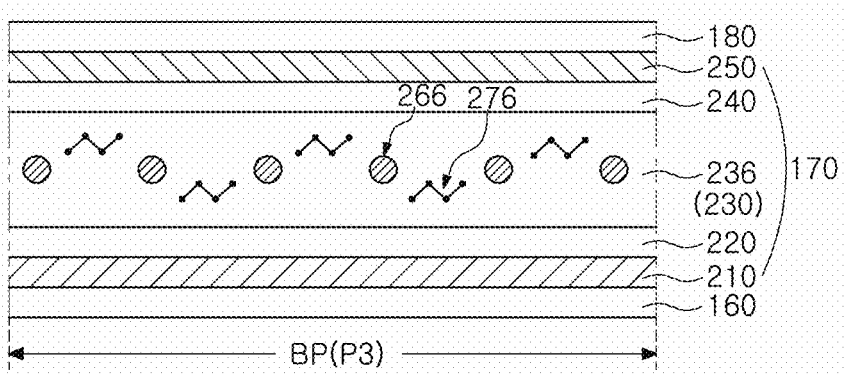

FIGS. 3A to 3C are schematic cross-sectional views of an emitting diode in each pixel of the electroluminescent display device according to the first aspect of the present disclosure.

As shown in FIGS. 3A to 3C, the emitting diode D in each of a green pixel GP, a red pixel RP and a blue pixel BP includes the first electrode 160, the second electrode 180 facing the first electrode 160 and the emitting layer 170 positioned between the first and second electrodes 160 and 180 and including the EML 230. A first EML 232 in the green pixel GP includes a first QD 262 and a first amorphous oxide semiconductor material 272, and a second EML 234 in the red pixel RP includes a second QD 264 and a second amorphous oxide semiconductor material 274. A third EML 236 in the blue pixel BP includes a third QD 266 and a third amorphous oxide semiconductor material 276.

In addition, the emitting layer 170 may further include the HTL 220 between the first electrode 160 and the EML 230 and the HIL 210 between the first electrode 160 and the HTL 220. Further, the emitting layer 170 may further include the ETL 240 between the EML 230 and the second electrode 180 and the EIL 250 between the ETL 240 and the second electrode 180. At least one of the HTL 220, the HIL 210, the ETL 240 and the EIL 250 may be omitted.

The first to third QD 262, 264 and 266 respectively emit green light, red light and blue light.

The first to third amorphous oxide semiconductor materials 272, 274 and 276 may be a-IGZO. The first third amorphous oxide semiconductor materials may be same. Namely, in the first to third amorphous oxide semiconductor materials 272 to 276, the indium atom, the gallium atom and the zinc atom may have the same mole fraction.

The first to third amorphous oxide semiconductor materials 272 to 276 serve as a protection layer (or a base layer) blocking or preventing the penetration of external moisture to the QDs 262 to 266. In addition, due to the gallium atom having strong combination strength with oxygen, the penetration of oxygen to the QDs 262 to 266 is also blocked or prevented by the first to third amorphous oxide semiconductor materials 272 to 276.

Moreover, since an energy level of the first to third amorphous oxide semiconductor materials 272 to 276 is matched with the energy level of the first to third QDs 262 to 266, the charge transfer property is improved such that the emitting property of the emitting diode D is improved.

Furthermore, the first to third QDs 262 to 266 are dispersed in the first to third amorphous oxide semiconductor materials 272 to 276 such that the aggregation of the QDs 262 to 266 is prevented. As a result, the emitting efficiency decrease by QD quenching is prevented.

On the other hand, when a crystalline oxide semiconductor material is used instead of the amorphous oxide semiconductor material, the QDs 262 to 266 may be damaged. Namely, since a high temperature curing process of about 300 to 350° C. is required to cure the crystalline oxide semiconductor material, the damage on the QDs 262 to 266 may be generated by the high temperature curing process. However, since the amorphous oxide semiconductor material can be cured by a low temperature curing process of about 100 to 150° C., the above damage on the QDs 262 to 266 can be prevented.

[Thermal Stability]

Figure 4:
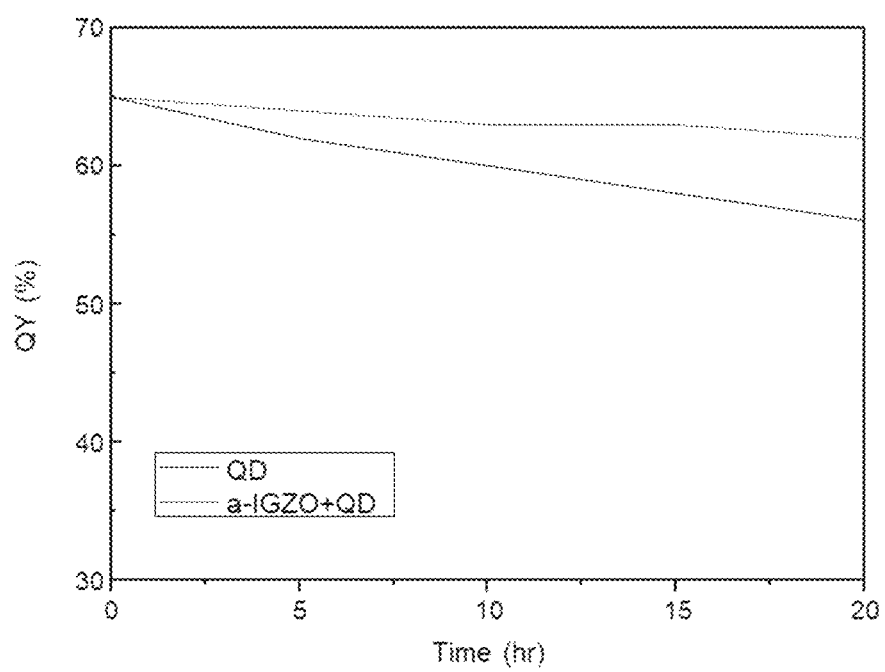
FIG. 4 is a graph illustrating an emitting efficiency of a QD layer with an amorphous oxide semiconductor material.
Figure 5B:
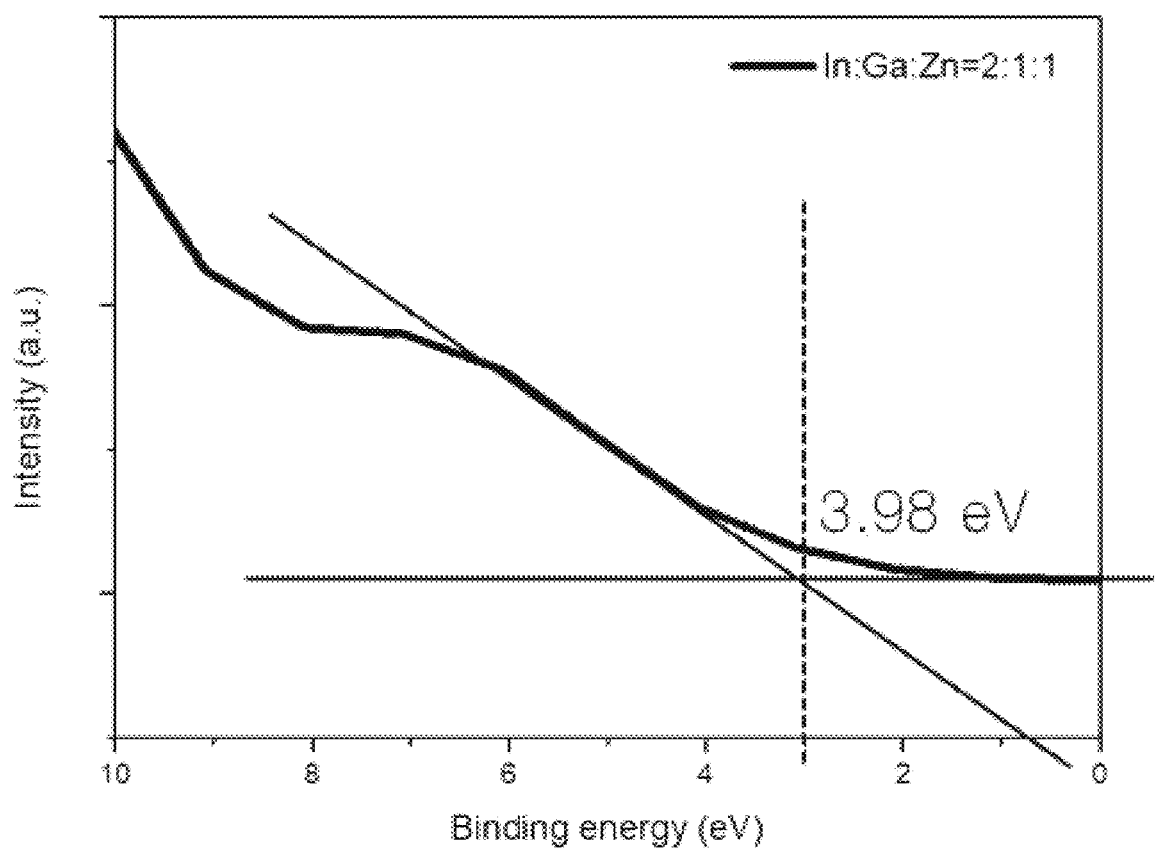
Figure 5C:
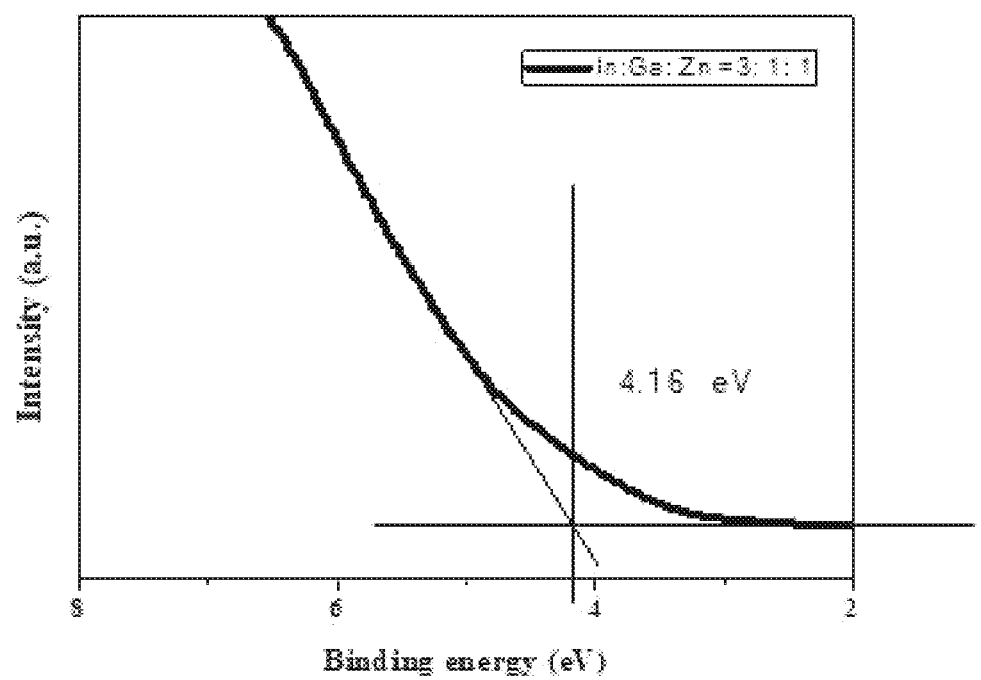
Figure 5E:
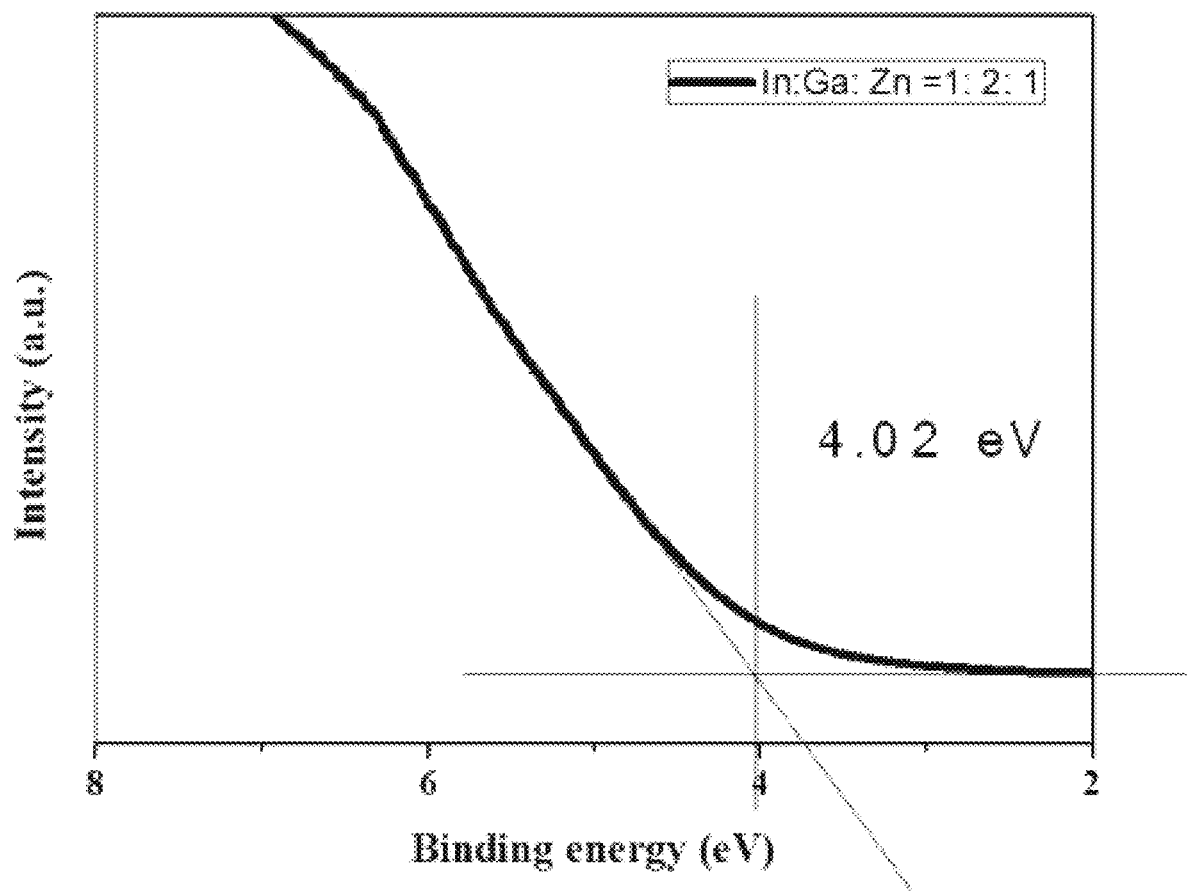

The quantum yield (QY) of the QD in a layer including only the QDs and a layer including the QDs and the amorphous oxide semiconductor material (a-IGZO) is measured under a temperature condition of 80° C. and is shown in FIG. 4.

(1) Formation of the layer including the QDs and the amorphous oxide semiconductor material (a-IGZO)

Indium chloride (0.1M), gallium nitrate hydrate (0.1M), zinc chloride (0.1M) and ethanolamine were dissolved in 2-methoxyethanol and were stirred under a temperature of 50° C. for 1 hr. After the mixture was additionally stirred for 24 hrs., the QDs (10 vol %) in hexane were added. Under $N_2$ condition, the mixture was coated on the wafer, and the layer was thermally treated under a temperature of 80° C. for 1 hr.

As shown in FIG. 4, the proportion of the quantum yield decrease of the QD in the layer including the QDs and the amorphous oxide semiconductor material (a-IGZO) is decreased. Namely, the oxygen is absorbed by the amorphous oxide semiconductor material such that the damage of the QD is prevented.

Alternatively, in the first to third amorphous oxide semiconductor materials 272 to 276, the indium atom, the gallium atom and the zinc atom may have a difference in a mole fraction.

Namely, in the first amorphous oxide semiconductor material 272, the gallium atom and the zinc atom respectively have a first mole fraction and a second mole fraction with respect to the indium atom. In the second amorphous oxide semiconductor material 274, the gallium atom has a third mole fraction, which is greater than the first mole fraction, with respect to the indium atom. In the second amorphous oxide semiconductor material 274, the zinc atom has a fourth mole fraction, which is greater than the second mole fraction, with respect to the indium atom. In addition, in the second amorphous oxide semiconductor material 274, the mole fraction of each of the gallium atom and the zinc atom with respect to the indium atom may be greater than the first and second mole fraction, respectively.

In the third amorphous oxide semiconductor material 276, the gallium atom and the zinc atom respectively have a fifth mole fraction and a sixth mole fraction. The fifth and sixth mole fractions are respectively smaller than the first and second mole fractions.

For example, in the first amorphous oxide semiconductor material 272, the mole ratio of the indium atom, the gallium atom and the zinc atom may be 1:1:1. In the second amorphous oxide semiconductor material 274, the mole ratio of the indium atom, the gallium atom and the zinc atom may be 1:1.1~3:1.1~3. In the third amorphous oxide semiconductor material 276, the mole ratio of the indium atom, the gallium atom and the zinc atom may be 1.1~3:1:1.

Since the indium atom, the gallium atom and the zinc atom have different mole fractions in the first to third amorphous oxide semiconductor materials 272 to 276, the first to third amorphous oxide semiconductor materials 272 to 276 have a difference in a valance band maximum level (or a highest occupied molecular orbital (HOMO) maximum level).

FIGS. 5A to 5E are graphs showing an UPS (ultraviolet photoelectron spectroscopy) measuring results of the amorphous oxide semiconductor materials having difference mole fractions of the indium atom, the gallium atom and the zinc atom, and the valance band maximum level (VBM) of the amorphous oxide semiconductor material according to the mole fraction of the indium atom, the gallium atom and the zinc atom is listed in Table 1.

Figure 6A:
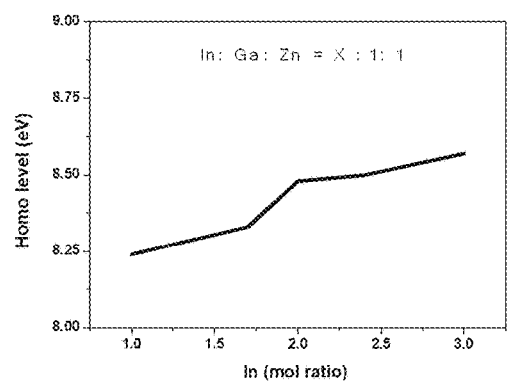
FIGS. 6A to 6C are graphs showing changes of a valence band maximum level of an amorphous oxide semiconductor material according to a mole fraction of indium, gallium and zinc.
Figure 6B:
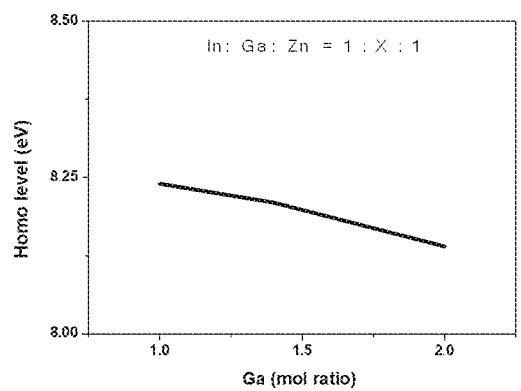
Figure 6C:
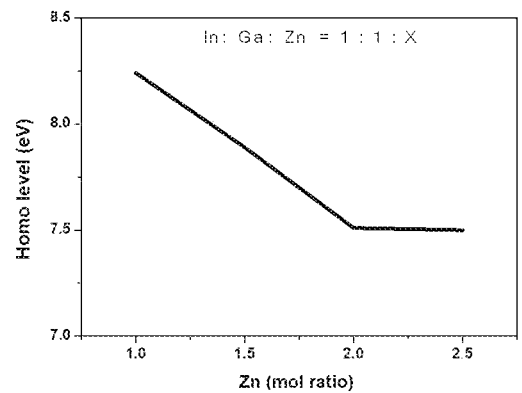

In addition, FIGS. 6A to 6C are graphs showing changes of a valence band maximum level of an amorphous oxide semiconductor material according to a mole fraction of indium, gallium and zinc.

TABLE 1

| | Mole fraction | | | |
| --- | --- | --- | --- | --- |
| | In | Ga | Zn | VBM |
| IGZO (Ex1) | 1 | 1 | 1 | 8.24 eV |
| IGZO (Ex2) | 2 | 1 | 1 | 8.48 eV |

TABLE 1-continued

| | Mole fraction | | | |
| --- | --- | --- | --- | --- |
| | In | Ga | Zn | VBM |
| IGZO | 1.7 | 1 | 1 | 8.33 eV |
| IGZO | 2.4 | 1 | 1 | 8.50 eV |
| IGZO (Ex3) | 3 | 1 | 1 | 8.57 eV |
| IGZO (Ex4) | 1 | 1 | 2 | 7.51 eV |
| IGZO | 1 | 1 | 1.5 | 7.89 eV |
| IGZO | 1 | 1 | 2.5 | 7.47 eV |
| IGZO (Ex5) | 1 | 2 | 1 | 8.14 eV |
| IGZO | 1 | 2 | 2 | 8.02 eV |

As shown in Table 1, FIGS. 5A to 5E and FIGS. 6A to 6C, with respect to the amorphous oxide semiconductor material having the indium/gallium/zinc mole ratio of 1:1:1, the valance band maximum level of the amorphous oxide semiconductor material is increased when the indium mole fraction is increased, and the valance band maximum level of the amorphous oxide semiconductor material is decreased when the gallium mole fraction and/or the zinc mole fraction is increased.

Figure 7A:
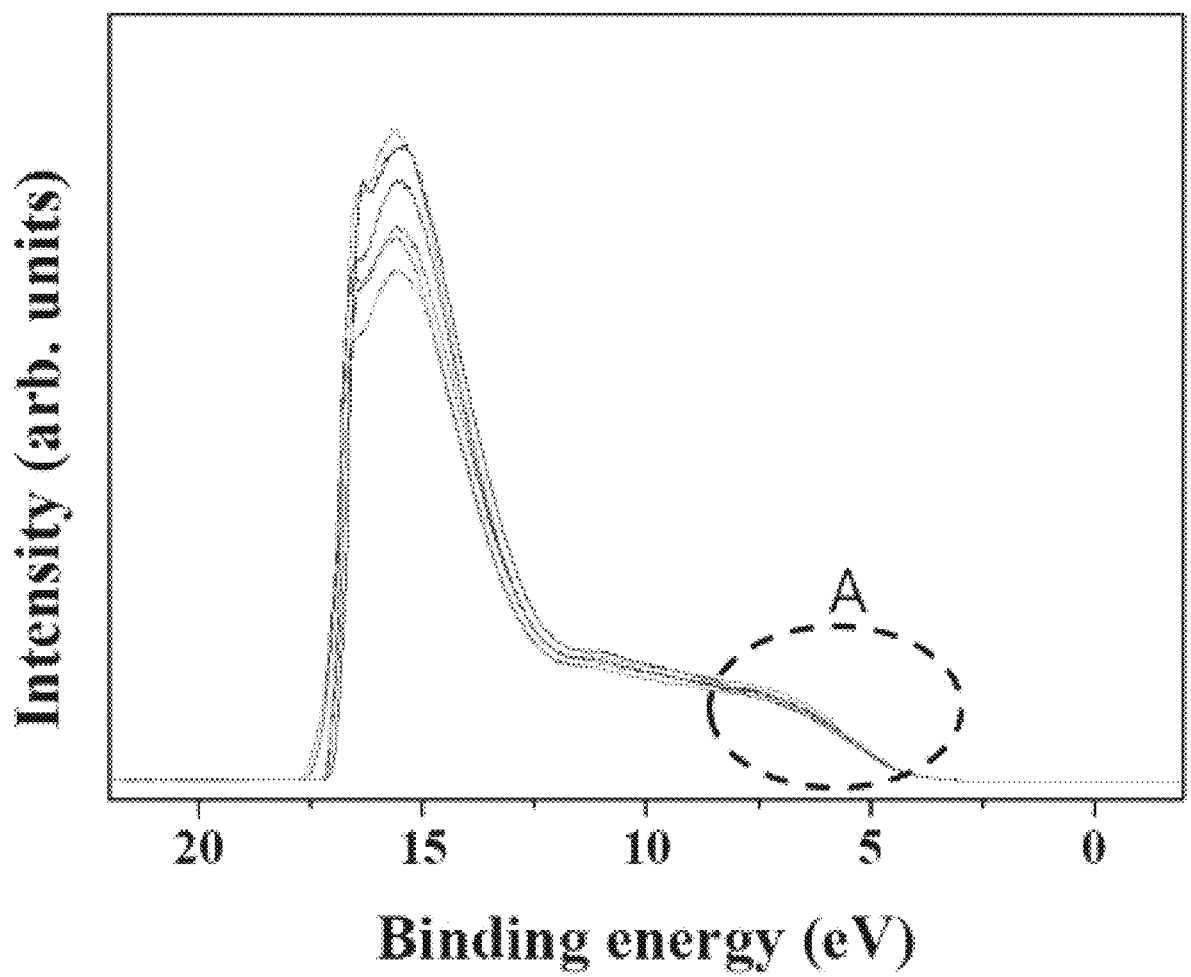
FIGS. 7A and 7B are graphs showing an UPS measuring results of a green QD.
Figure 7B:
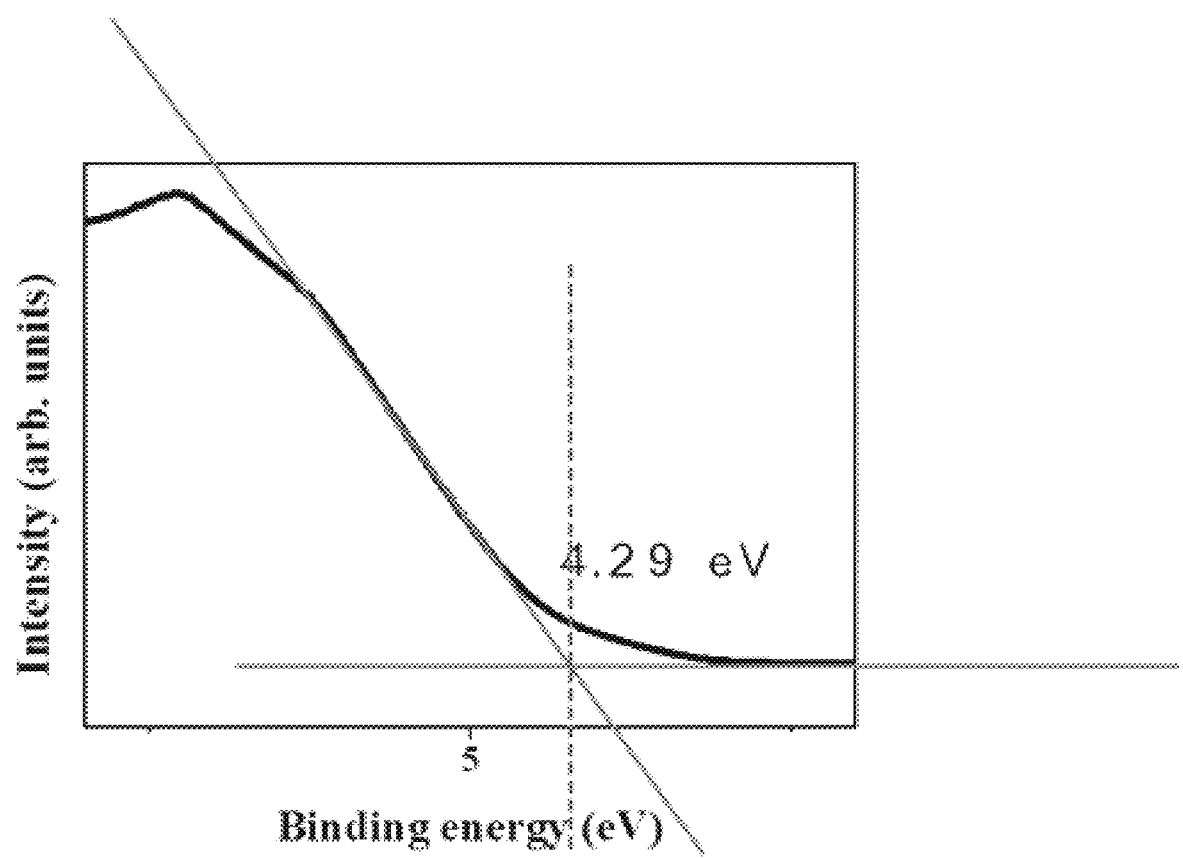
Figure 8A:
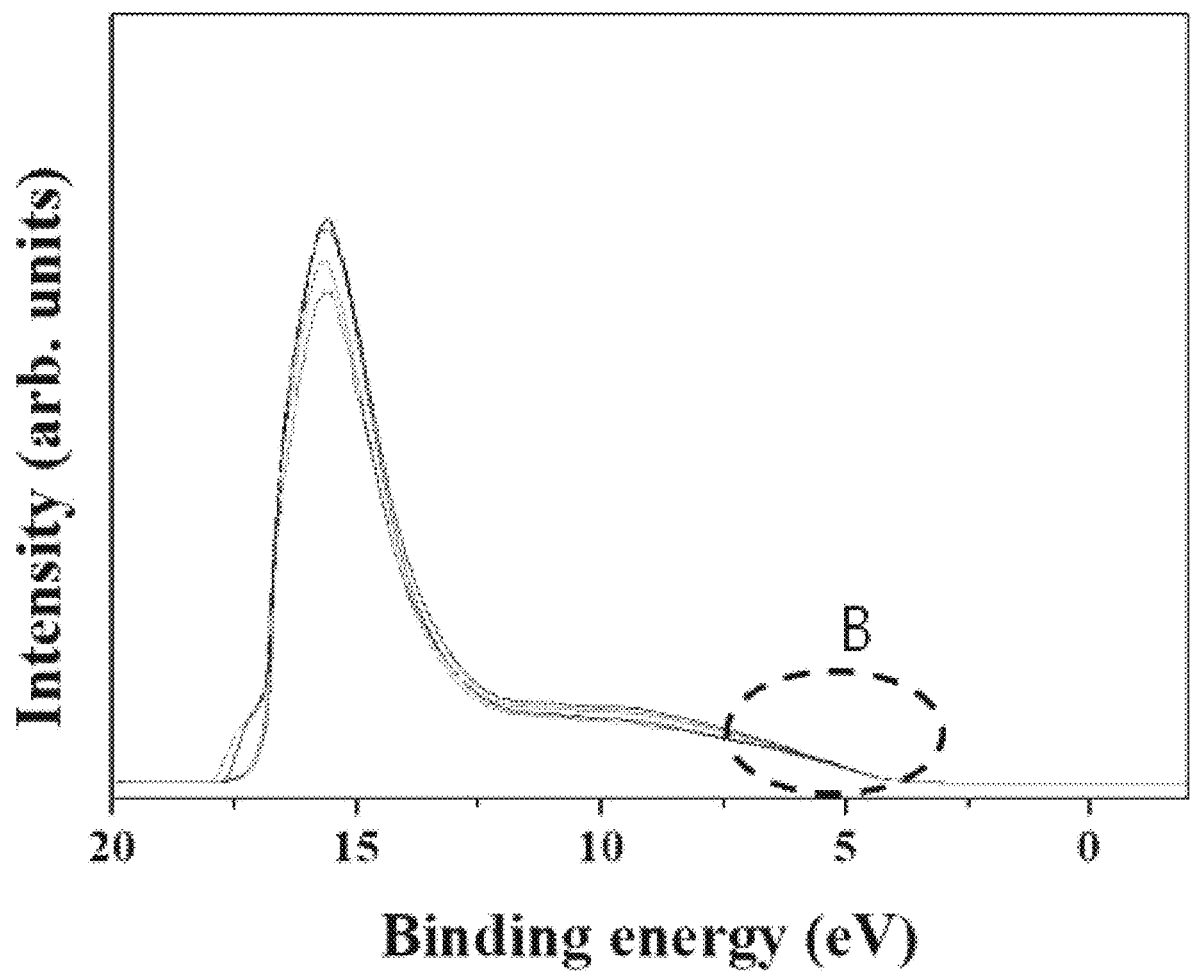
FIGS. 8A and 8B are graphs showing an UPS measuring results of a red QD.
Figure 8B:
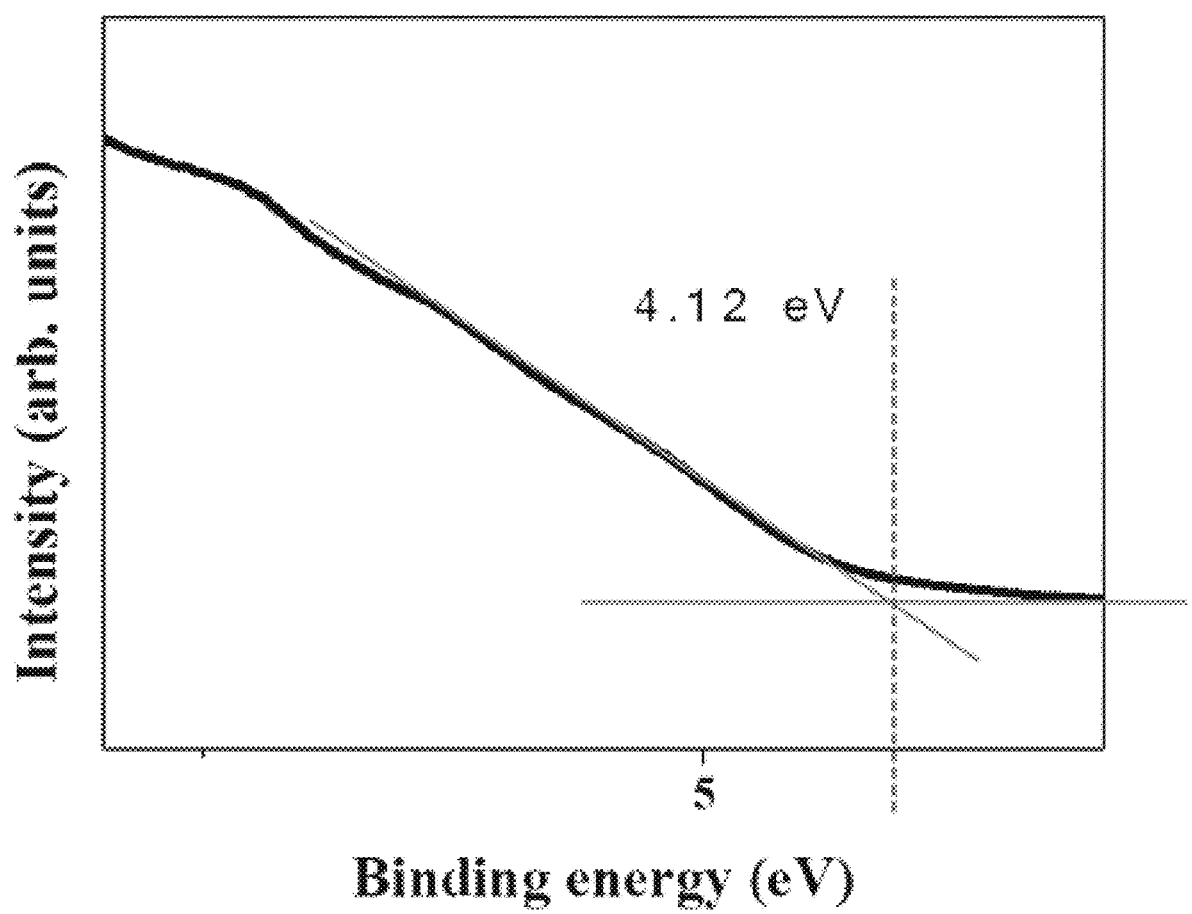
Figure 9B:
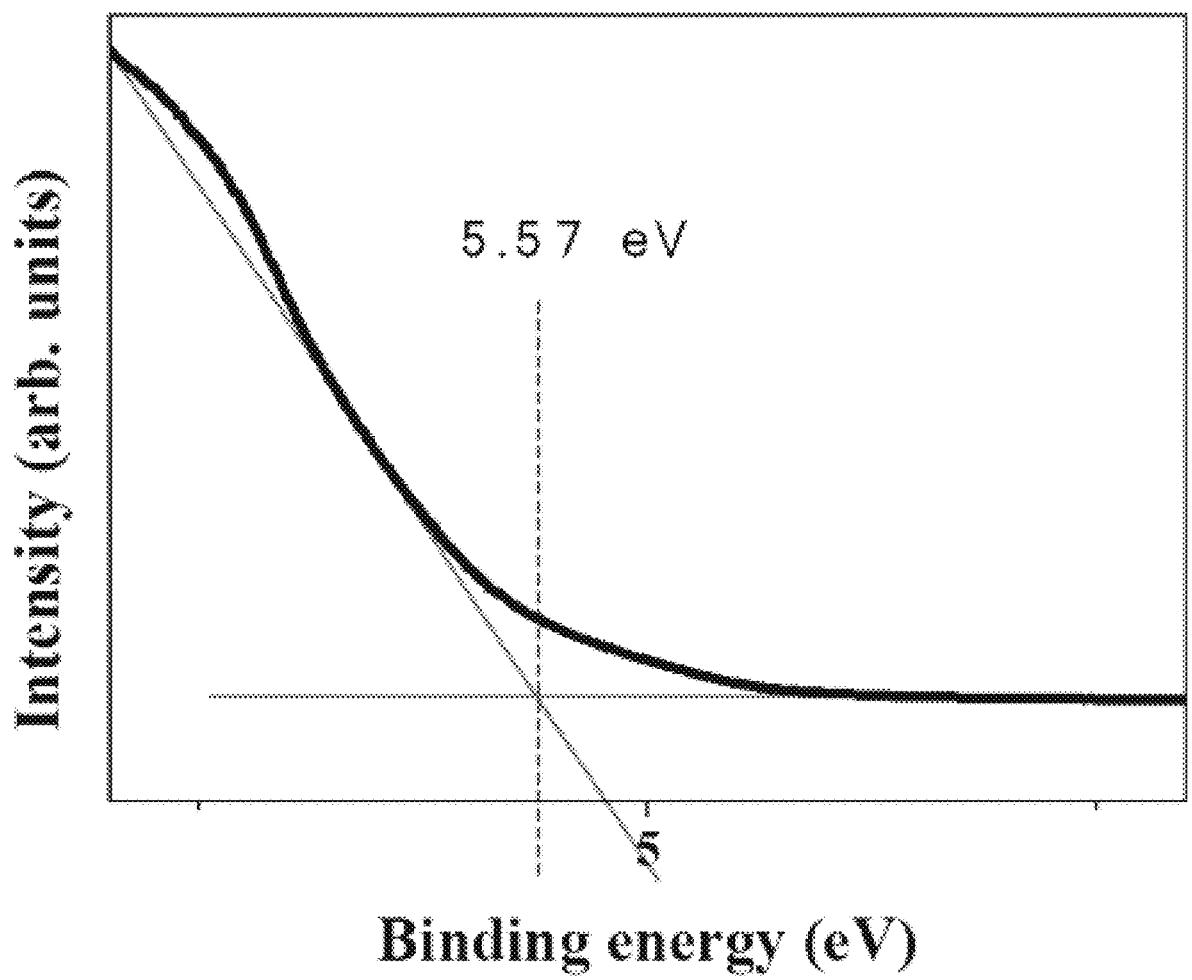

The UPS results of the green QD having InP/ZnSe/ZnS structure are shown in FIGS. 7A and 7B, the UPS results of the red QD having InP/ZnSe/ZnS structure are shown in FIGS. 8A and 8B, and the UPS results of the blue QD having ZnSe/ZnS structure are shown in FIGS. 9A and 9B. FIGS. 7B, 8B and 8B are enlarged view of the "A", "B" and "C" portions in FIGS. 7A, 8A and 9A, respectively. The valance band maximum level of the above QDs is listed in Table 2.

TABLE 2

| QD | VBM |
| --- | --- |
| Green | 8.42 eV |
| Red | 8.25 eV |
| Blue | 8.59 eV |

As shown in Table 2, the valance band maximum level of the green QD is greater than that of the red QD and smaller than that of the blue QD.

Accordingly, in the emitting diode D of the present disclosure, the valance band maximum level of the first QD 262 in the green pixel GP is greater than that of the second QD 264 in the red pixel RP and smaller than that of the third QD 266 in the blue pixel BP. To match the energy level of the first to third amorphous oxide semiconductor materials 272 to 276 with the first to third QDs 262 to 266, the first amorphous oxide semiconductor material 272 in the green pixel GP has the valance band maximum level being greater than the second amorphous oxide semiconductor material 274 in the red pixel RP and being smaller than the third amorphous oxide semiconductor material 276 in the blue pixel BP.

Namely, the first QD 262 in the first pixel P1 and the second QD 264 in the second pixel P2 have a difference in the valance band maximum level, and the first amorphous oxide semiconductor material 272 in the first pixel P1 and the second amorphous oxide semiconductor material 274 in the second pixel P2 also have a difference in the valance band maximum level. In other words, in the first amorphous oxide semiconductor material 272 in the first pixel P1 and the second amorphous oxide semiconductor material 274 in the second pixel P2, the mole fraction of the indium atom, the gallium atom and the zinc atom is different. In the first amorphous oxide semiconductor material 272 in the first pixel P1 and the second amorphous oxide semiconductor material 274 in the second pixel P2, the indium atom, the gallium atom and the zinc atom have different mole fractions.

The mole fraction of the gallium atom with respect to the indium atom in the second amorphous oxide semiconductor material 274 is greater than that in the first amorphous oxide semiconductor material 272. The mole fraction of the zinc atom with respect to the indium atom in the second amorphous oxide semiconductor material 274 is greater than that in the first amorphous oxide semiconductor material 272.

The third QD 266 in the third pixel P3 has a different valance band maximum level from the first and second QDs 262 and 264 respectively in the first and second pixels P1 and P2, and the third amorphous oxide semiconductor material 276 in the third pixel P3 has a different valance band maximum level from the first and second amorphous oxide semiconductor materials 272 and 274 respectively in the first and second pixels P1 and P2.

In other words, in the first amorphous oxide semiconductor material 272 in the first pixel P1, the second amorphous oxide semiconductor material 274 in the second pixel P2 and the third amorphous oxide semiconductor material 276 in the third pixel P3, the mole fraction of the indium atom, the gallium atom and the zinc atom is different. In the first amorphous oxide semiconductor material 272 in the first pixel P1, the second amorphous oxide semiconductor material 274 in the second pixel P2, the indium atom and the third amorphous oxide semiconductor material 276 in the third pixel P3, the indium atom, the gallium atom and the zinc atom have different mole fractions.

The mole fraction of the indium atom with respect to the gallium atom and/or the zinc atom in the third amorphous oxide semiconductor material 276 is greater than that in the first and second amorphous oxide semiconductor materials 272 and 274.

In the emitting diode D, since an energy level of the QDs 262 to 266 and the first to third amorphous oxide semiconductor materials 272 to 276 in the pixels P1, P2 and P3 is sufficiently matched, the charge injection transfer property into the QDs 262 to 266 is improved.

Accordingly, the emitting property of the emitting diode D and the electroluminescent display device 100 is improved.

[Emitting Diode]

The emitting diode is fabricated by sequentially stacking the anode, the HIL, the ETL, the EML, the ETL and the cathode. The property of the emitting diode with changing the mole fraction of the indium atom, the gallium atom and the zinc atom in the amorphous oxide semiconductor material of the EML in the green, red and blue pixels is measured and listed in Table 3.

TABLE 3

| | EML | Volt (V) | QY | Cd/m² | CIEx | CIEy |
|---|---|---|---|---|---|---|
| GP | QD | 4.3 | 0.92 | 280 | 0.376 | 0.571 |
| | a-IGZO (1:1:1) + QD | 3.9 | 1.18 | 373 | 0.377 | 0.578 |
| | a-IGZO (1:2:1) + QD | 4.0 | 1.01 | 369 | 0.375 | 1.577 |
| RP | QD | 5.6 | 2.76 | 166 | 0.681 | 0.313 |
| | a-IGZO (1:2:1) + QD | 4.8 | 3.61 | 253 | 0.683 | 0.315 |
| | a-IGZO (1:1:2) + QD | 5.2 | 3.05 | 222 | 0.681 | 0.312 |

TABLE 3-continued

| | EML | Volt (V) | QY | Cd/m² | CIEx | CIEy |
|---|---|---|---|---|---|---|
| BP | QD | 4.5 | 0.018 | 1.43 | 0.192 | 0.106 |
| | a-IGZO (2:1:1) + QD | 3.9 | 0.136 | 10.12 | 0.197 | 0.088 |

As shown in Table 3, in comparison to the emitting diode with the EML including only QD except the amorphous oxide semiconductor material, the emitting property of the emitting diode with the QD and the amorphous oxide semiconductor material is improved.

In addition, when the valance band maximum level of the amorphous oxide semiconductor material and the QD in the red, green and blue pixels is matched, the emitting property of the emitting diode D is further improved.

As mentioned above, in the emitting diode D and the electroluminescent display device 100 according to the first aspect of the present disclosure, the QDs 262 to 266 and the amorphous oxide semiconductor materials 272 to 276 are included in the EML 230 of the emitting layer 170, the damages on the QDs 262 to 266 by the external moisture and/or oxygen are prevented. In addition, since the QDs 262 to 266 are dispersed in the amorphous oxide semiconductor materials 272 to 276, the aggregation of the QDs 262 to 266 is prevented such that the emitting efficiency decrease by QD quenching is prevented.

Moreover, since the energy level of the amorphous oxide semiconductor materials is matched to that of the, the charge transfer property is improved such that the emitting property of the emitting diode D and the electroluminescent display device 100 is further improved.

Furthermore, the valance band maximum level of the amorphous oxide semiconductor material is matched to that of the QD, the emitting property of the emitting diode D and the electroluminescent display device 100 is further improved.

Figure 10:
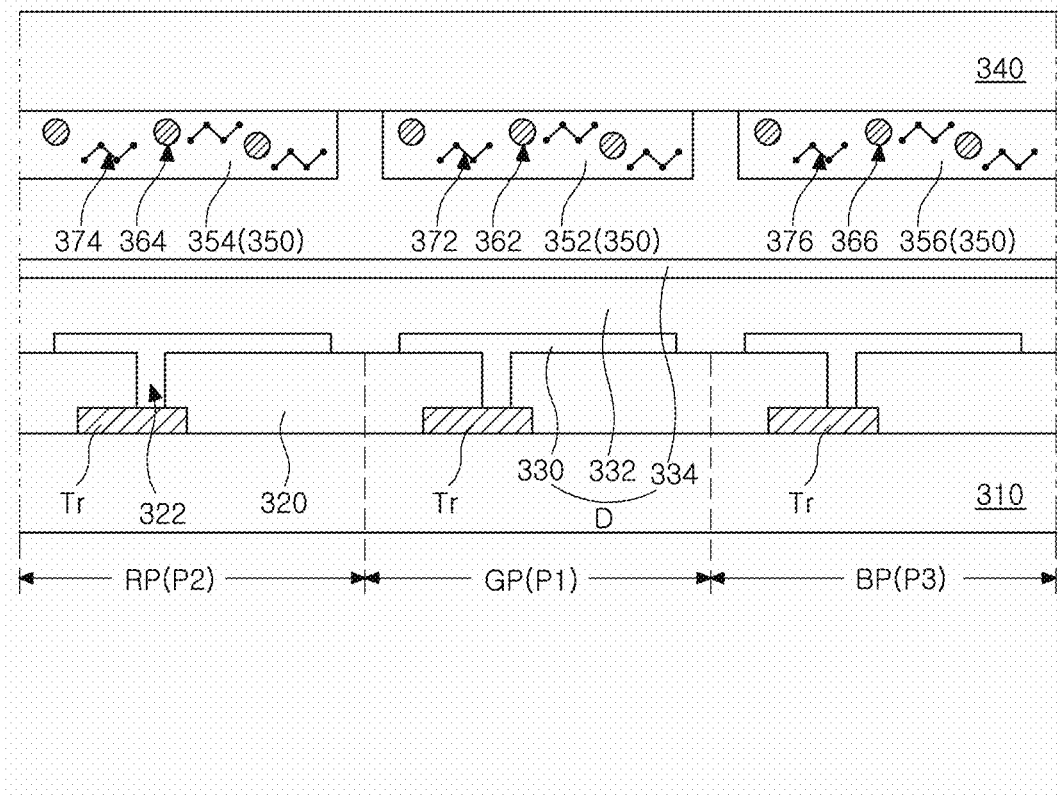
FIG. 10 is a schematic cross-sectional view of an electroluminescent display device according to a second aspect of the present disclosure.

FIG. 10 is a schematic cross-sectional view of an electroluminescent display device according to a second aspect of the present disclosure.

As shown in FIG. 10, the electroluminescent display device 300 according to the second aspect of the present disclosure includes a first substrate 310, a TFT Tr on or over the first substrate 310, an emitting diode D connected to the TFT Tr and a color conversion layer 350 on or over the emitting diode D.

The first substrate 310 may be a glass substrate or a plastic substrate. For example, the first substrate 310 may be formed of polyimide.

Although not shown, the TFT Tr may include a semiconductor layer, a gate electrode, a source electrode and a drain electrode.

A passivation layer 320, which includes a contact hole 322, is formed to cover the TFT Tr. For example, the drain electrode of the TFT Tr may be exposed by the contact hole 322.

The emitting diode D is formed on the passivation layer 320 and connected to the TFT Tr through the contact hole 322. The emitting diode D may be a white emitting diode.

Namely, the emitting diode D includes a first electrode 330, a second electrode 334 facing the first electrode 330 and an emitting layer 332 between the first and second electrodes 330 and 334, and the white light is emitted from the emitting layer 332. The emitting layer 332 may be formed by one-body to cover all of a red pixel RP, a green pixel GP and a blue pixel BP.

The first electrode 330 may be an anode and may be formed of a conductive material having a relatively high work function. For example, the first electrode 330 may be formed of a transparent conductive material such as indium-tin-oxide (ITO) or indium-zinc-oxide (IZO).

When the electroluminescent display device 300 is operated in a top-emission type, a reflection electrode or a reflection layer may be formed under the first electrode 330. For example, the reflection electrode or the reflection layer may be formed of aluminum-palladium-copper (APC) alloy.

The second electrode 334 may be formed of a conductive material having a relatively low work function to serve as a cathode. For example, the second electrode 34 may be formed of aluminum (Al), magnesium (Mg) or Al—Mg alloy.

When the electroluminescent display device 300 is operated in a top-emission type, the second electrode 334 has a thin thickness to transmit the light.

Figure 11:
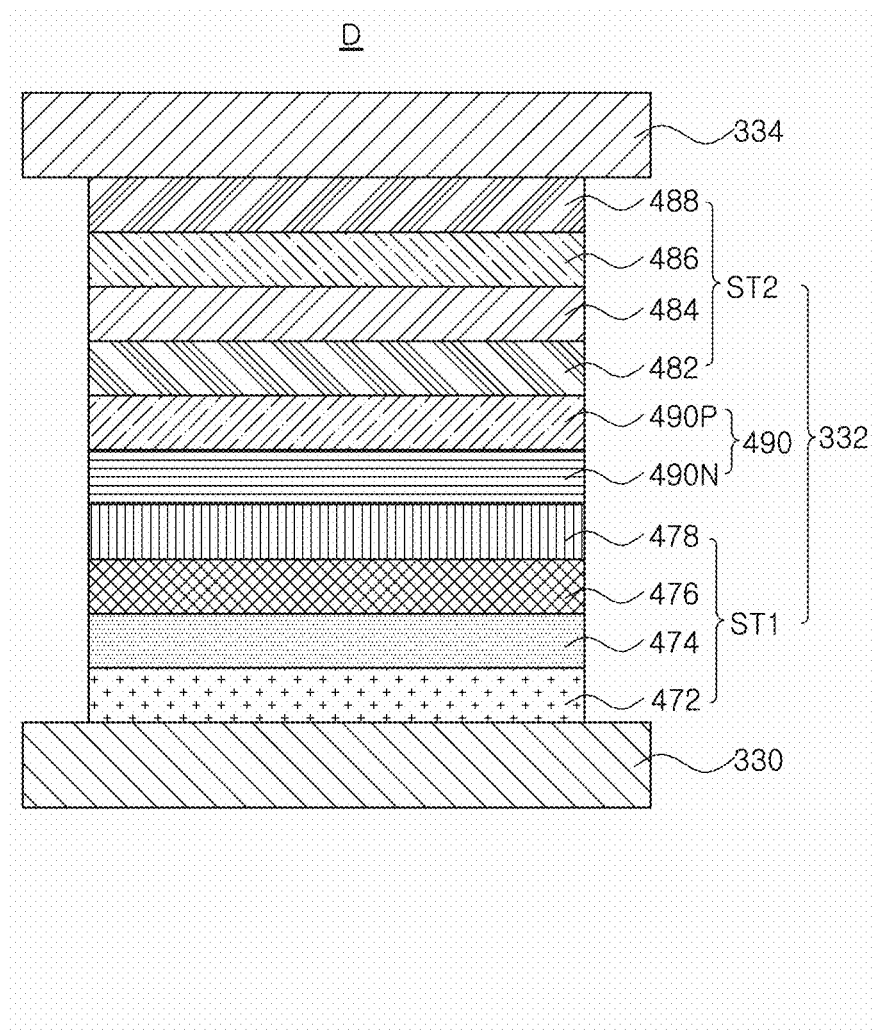
FIG. 11 is a schematic cross-sectional view of an emitting diode of the electroluminescent display device according to the first aspect of the present disclosure.

Referring to FIG. 11, which is a schematic cross-sectional view of an emitting diode of the electroluminescent display device according to the first aspect of the present disclosure, the emitting layer 332, which is positioned between the first and second electrodes 330 and 334, may include a first emitting part ST1, which includes a first EML 476, a second emitting part ST2, which includes a second EML 484, and a charge generation layer 490 between the first and second emitting parts ST1 and ST2.

The first emitting part ST1, the charge generation layer 490 and the second emitting part ST2 are sequentially stacked on the first electrode 330. Namely, the first emitting part ST1 is positioned between the first electrode 330 and the charge generation layer 490, and the second emitting part ST2 is positioned between the second electrode 334 and the charge generation layer 490.

The first emitting part ST1 may further include an HIL 472 between the first electrode 330 and the first EML 476, a first HTL 474 between the HIL 472 and the first EML 476 and a first ETL 478 between the first EML 476 and the charge generation layer 490. At least one of the HIL 472, the first HTL 474 and the first ETL 478 may be omitted.

The second emitting part ST2 may further include a second HTL 482 between the charge generation layer 490 and the second EML 484, a second ETL 486 between the second EML 484 and the second electrode 334 and an EIL 488 between the second ETL 486 and the second electrode 334. At least one of the second HTL 482, the second ETL 486 and the EIL 488 may be omitted.

The charge generation layer 490 is positioned between the first and second parts ST1 and ST2. Namely, the first and second emitting parts ST1 and ST2 are connected by the charge generation layer 490. For example, the charge generation layer 490 may be a PN junction layer of an N-type charge generation layer 490N and a P-type charge generation layer 490P.

The N-type charge generation layer 490N is positioned between the first ETL 478 and the second HTL 482, and the P-type charge generation layer 490 P is positioned between the N-type charge generation layer 490N and the second HTL 482.

The charge generation layer 490 generates charges or separates the charge into the hole and the electron such that the hole and the electron are respectively provided into the second emitting part ST2 and the first emitting part ST1.

The N-type charge generation layer 490N provides the electron into the first ETL 478 of the first emitting part ST1, and the first ETL 478 provides the electron into the first EML 476 adjacent to the first electrode 330. The P-type charge generation layer 490 P provides the hole into the second HTL 482 of the second emitting part ST2, and the second HTL 482 provides the hole into the second EML 484 adjacent to the second electrode 334. Accordingly, the emitting efficiency of the emitting diode D including the first and second EMLs 476 and 484 is improved, and the driving voltage of the emitting diode D is lowered.

For example, one of the first and second EMLs 476 and 484 may include a blue emitting material, and the other one of the first and second EMLs 476 and 484 may include a yellow emitting material. The lights emitted from the first and second EMLs 476 and 484 are mixed such that the white light is emitted from the emitting diode D.

For example, each of the blue emitting material and the yellow emitting material may be an organic emitting material having a phosphorescent property or a fluorescent property or an inorganic emitting material such as the QD.

The second substrate 340 is disposed over the emitting diode D, and the color conversion layer 350 is formed on an inner side of the second substrate 340.

The color conversion layer 350 includes first to third color conversion layer 352, 354 and 356 respectively corresponding to the green, red and blue pixels GP, RP and BP.

The first color conversion layer 352 includes a first QD 362 and a first amorphous oxide semiconductor material 372, and a second color conversion layer 354 includes a second QD 364 and a second amorphous oxide semiconductor material 374. A third color conversion layer 356 includes a third QD 366 and a third amorphous oxide semiconductor material 376.

The first to third QDs 362 to 366 are green, red and blue QDs, respectively, such that the electroluminescent display device 300 can provide a color image.

The first to third amorphous oxide semiconductor materials 372 to 376 may be a-IGZO.

The first to third amorphous oxide semiconductor materials 372 to 376 serve as a protection layer (or a base layer) blocking or preventing the penetration of external moisture to the QDs 362 to 366. In addition, due to the gallium atom having strong combination strength with oxygen, the penetration of oxygen to the QDs 362 to 366 is also blocked or prevented by the first to third amorphous oxide semiconductor materials 372 to 376.

Moreover, the first to third QDs 362 to 366 are dispersed in the first to third amorphous oxide semiconductor materials 372 to 376 such that the aggregation of the QDs 362 to 366 is prevented. As a result, the emitting efficiency decrease by QD quenching is prevented.

Furthermore, since the amorphous oxide semiconductor materials 372 to 376 can be cured by a relatively low curing process of about 100 to 150° C., the damage on the QDs 362 to 366 by a high curing process is prevented.

Since the energy level of the amorphous oxide semiconductor materials 372 to 376 is matched to that of the QDs 362 to 366, the extinction efficiency of the QDs 362 to 366 to the light energy from the emitting diode D, i.e., the light energy absorbing efficiency, and the emitting property of the QDs 362 to 366 are improved.

In the first to third amorphous oxide semiconductor materials 372 to 376, the indium atom, the gallium atom and the zinc atom may have the same mole fraction. Alternatively, in the first to third amorphous oxide semiconductor materials 372 to 376, the indium atom, the gallium atom and the zinc atom may have a difference in the mole fraction.

As mentioned above, since the QDs 362 to 366 have a difference in the valance band maximum level, the first to third amorphous oxide semiconductor materials 372 to 376 may also have a difference in the valance band maximum level.

For example, the valance band maximum level of the first QD 362 in the green pixel GP is greater than that of the second QD 364 in the red pixel RP and smaller than that of the third QD 366 in the blue pixel BP.

Namely, the first QD 362 of the first color conversion layer 352 in the first pixel P1 and the second QD 364 of the second color conversion layer 354 in the second pixel P2 have a difference in the valance band maximum level, and the first amorphous oxide semiconductor material 372 of the first color conversion layer 352 in the first pixel P1 and the second amorphous oxide semiconductor material 374 of the second color conversion layer 354 in the second pixel P2 also have a difference in the valance band maximum level. In other words, in the first amorphous oxide semiconductor material 372 of the first color conversion layer 352 and the second amorphous oxide semiconductor material 374 of the second color conversion layer 354, the mole fraction of the indium atom, the gallium atom and the zinc atom is different. In the first amorphous oxide semiconductor material 372 of the first color conversion layer 352 and the second amorphous oxide semiconductor material 374 of the second color conversion layer 354, the indium atom, the gallium atom and the zinc atom have different mole fractions.

The mole fraction of the gallium atom with respect to the indium atom in the second amorphous oxide semiconductor material 374 is greater than that in the first amorphous oxide semiconductor material 372. The mole fraction of the zinc atom with respect to the indium atom in the second amorphous oxide semiconductor material 374 is greater than that in the first amorphous oxide semiconductor material 372.

The third QD 366 of the third color conversion layer 356 in the third pixel P3 has a different valance band maximum level from the first and second QDs 362 and 364 of the first and second color conversion layers 352 and 354 in the first and second pixels P1 and P2, respectively, and the third amorphous oxide semiconductor material 376 of the third color conversion layer 356 in the third pixel P3 has a different valance band maximum level from the first and second amorphous oxide semiconductor materials 372 and 374 of the first and second color conversion layers 352 and 354 in the first and second pixels P1 and P2, respectively.

In other words, in the first amorphous oxide semiconductor material 372 in the first color conversion layer 352, the second amorphous oxide semiconductor material 374 in the second color conversion layer 354 and the third amorphous oxide semiconductor material 376 in the third color conversion layer 356, the mole fraction of the indium atom, the gallium atom and the zinc atom is different. In the first amorphous oxide semiconductor material 372 in the first color conversion layer 352, the second amorphous oxide semiconductor material 374 in the second color conversion layer 354, the indium atom and the third amorphous oxide semiconductor material 376 in the third color conversion layer 356, the indium atom, the gallium atom and the zinc atom have different mole fractions.

The mole fraction of the indium atom with respect to the gallium atom and/or the zinc atom in the third amorphous oxide semiconductor material 376 is greater than that in the first and second amorphous oxide semiconductor materials 372 and 374.

In FIG. 10, the color conversion layer 350 is spaced apart from the second electrode 334, but it is not limited thereto. For example, the color conversion layer 350 may contact the second electrode 334 or may be adhered onto the second electrode 334 by an adhesive layer. In addition, the color conversion layer 350 may be positioned between the emitting diode D and the first substrate 310 in a bottom-emission type electroluminescent display device.

Although not shown, a green color filter, a red color filter and a blue color filter may be positioned between each of the first to third color conversion layers 352, 354 and 356 and the second substrate 340.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An emitting diode, comprising: a first electrode in a first pixel; a first emitting layer positioned on the first electrode and including a first amorphous oxide semiconductor material and a first quantum dot, wherein the first amorphous oxide semiconductor material includes an indium atom, a gallium atom and a zinc atom; and a second electrode covering the first emitting layer; wherein the first amorphous oxide semiconductor material has an energy level matching an energy level of the first quantum dot and the matched energy level enhances a charge transfer property of the emitting diode; further comprising a second emitting layer in a second pixel and including a second amorphous oxide semiconductor material and a second quantum dot, wherein the second amorphous oxide semiconductor material includes an indium atom, a gallium atom and a zinc atom.

2. The emitting diode according to claim 1, wherein the indium atom, the gallium atom and the zinc atom in the first amorphous oxide semiconductor material and the indium atom, the gallium atom and the zinc atom in the second amorphous oxide semiconductor material have a difference in a mole fraction.

3. The emitting diode according to claim 2, wherein the gallium atom in the first amorphous oxide semiconductor material has a first mole fraction with respect to the indium atom, and the gallium atom in the second amorphous oxide semiconductor material has a second mole fraction with respect to the indium atom,
wherein the second mole fraction is greater than the first mole fraction.

4. The emitting diode according to claim 2, wherein the zinc atom in the first amorphous oxide semiconductor material has a third mole fraction with respect to the indium atom, and the zinc atom in the second amorphous oxide semiconductor material has a fourth mole fraction with respect to the indium atom,
wherein the fourth mole fraction is greater than the third mole fraction.

5. The emitting diode according to claim 2, wherein the first quantum dot has a valance band maximum level greater than the second quantum dot, and the first amorphous oxide semiconductor material has a valance band maximum level greater than the second amorphous oxide semiconductor material.

6. The emitting diode according to claim 1, further comprising a third emitting layer in a third pixel and including a third amorphous oxide semiconductor material and a third quantum dot, wherein the third amorphous oxide semiconductor material includes an indium atom, a gallium atom and a zinc atom.

7. The emitting diode according to claim 6, wherein the indium atom, the gallium atom and the zinc atom in the first amorphous oxide semiconductor material and the indium atom, the gallium atom and the zinc atom in the third amorphous oxide semiconductor material have a difference in a mole fraction.

8. The emitting diode according to claim 7, wherein the indium atom in the first amorphous oxide semiconductor material has a fifth mole fraction with respect to the gallium atom, and the indium atom in the third amorphous oxide semiconductor material has a sixth mole fraction with respect to the gallium atom,
wherein the sixth mole fraction is greater than the fifth mole fraction.

9. The emitting diode according to claim 6, wherein the first quantum dot has a valance band maximum level smaller than the third quantum dot, and the first amorphous oxide semiconductor material has a valance band maximum level smaller than the third amorphous oxide semiconductor material.

10. An electroluminescent display device including an emitting diode on a substrate, comprising: a first electrode in a first pixel; a first emitting layer positioned on the first electrode and including a first amorphous oxide semiconductor material and a first quantum dot, wherein the first amorphous oxide semiconductor material includes an indium atom, a gallium atom and a zinc atom; and a second electrode covering the emitting layer; and a thin film transistor positioned between the substrate and the emitting diode, and connected to the first electrode, wherein the first amorphous oxide semiconductor material has an energy level matching an energy level of the first quantum dot and the matched energy level enhances a charge transfer property of the emitting diode; further comprising a second emitting layer in a second pixel and including a second amorphous oxide semiconductor material and a second quantum dot, wherein the second amorphous oxide semiconductor material includes an indium atom, a gallium atom and a zinc atom.

11. An electroluminescent display device, comprising: a substrate including a first pixel; an emitting diode on the substrate; a thin film transistor positioned between the substrate and the emitting diode, and connected to the emitting diode; and a first color conversion layer in the first pixel, wherein the first color conversion layer includes a first amorphous oxide semiconductor material and a first quantum dot, and the first amorphous oxide semiconductor material includes an indium atom, a gallium atom and a zinc atom; further comprising a second color conversion layer in a second pixel and including a second amorphous oxide semiconductor material and a second quantum dot, wherein the second amorphous oxide semiconductor material includes the indium atom, the gallium atom and the zinc atom.

12. The electroluminescent display device according to claim 11, wherein the first color conversion layer is positioned between the substrate and the emitting diode and disposed over the emitting diode.

13. The electroluminescent display device according to claim 11, wherein the indium atom, the gallium atom and the zinc atom in the first amorphous oxide semiconductor material and the indium atom, the gallium atom and the zinc atom in the second amorphous oxide semiconductor material have a difference in a mole fraction.

14. The electroluminescent display device according to claim 13, wherein the gallium atom in the first amorphous oxide semiconductor material has a first mole fraction with respect to the indium atom, and the gallium atom in the second amorphous oxide semiconductor material has a second mole fraction with respect to the indium atom,
wherein the second mole fraction is greater than the first mole fraction.

15. The electroluminescent display device according to claim 13, wherein the zinc atom in the first amorphous oxide semiconductor material has a third mole fraction with respect to the indium atom, and the zinc atom in the second amorphous oxide semiconductor material has a fourth mole fraction with respect to the indium atom,
wherein the fourth mole fraction is greater than the third mole fraction.

16. The electroluminescent display device according to claim 14, wherein the first quantum dot has a valance band maximum level greater than the second quantum dot, and the first amorphous oxide semiconductor material has a valance band maximum level greater than the second amorphous oxide semiconductor material.

17. The electroluminescent display device according to claim 12, further comprising a third emitting layer in a third pixel and including a third amorphous oxide semiconductor material and a third quantum dot, wherein the third amorphous oxide semiconductor material includes the indium atom, the gallium atom and the zinc atom.

18. The electroluminescent display device according to claim 17, wherein the indium atom, the gallium atom and the zinc atom in the first amorphous oxide semiconductor material and the indium atom, the gallium atom and the zinc atom in the third amorphous oxide semiconductor material have a difference in a mole fraction.

19. The electroluminescent display device according to claim 18, wherein the indium atom in the first amorphous oxide semiconductor material has a fifth mole fraction with respect to the gallium atom, and the indium atom in the third amorphous oxide semiconductor material has a sixth mole fraction with respect to the gallium atom,
wherein the sixth mole fraction is greater than the fifth mole fraction.

20. The electroluminescent display device according to claim 17, wherein the first quantum dot has a valance band maximum level smaller than the third quantum dot, and the first amorphous oxide semiconductor material has a valance band maximum level smaller than the third amorphous oxide semiconductor material.

* * * * *